(12) United States Patent
Iwasaki et al.

(10) Patent No.: US 8,334,193 B2
(45) Date of Patent: Dec. 18, 2012

(54) METHOD OF MANUFACTURING SEMICONDUCTOR DEVICE

(75) Inventors: Shinya Iwasaki, Toyota (JP); Akira Kamei, Nissin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 13/242,789

(22) Filed: Sep. 23, 2011

(65) Prior Publication Data

US 2012/0015508 A1    Jan. 19, 2012

Related U.S. Application Data

(63) Continuation of application No. PCT/JP2009/070911, filed on Dec. 15, 2009.

(51) Int. Cl.
- H01L 21/20 (2006.01)
- H01L 21/425 (2006.01)
- H01L 21/04 (2006.01)

(52) U.S. Cl. ........ 438/478; 438/510; 438/515; 438/531; 257/E21.002

(58) Field of Classification Search .......... None
See application file for complete search history.

(56) References Cited

U.S. PATENT DOCUMENTS

| | | | |
|---|---|---|---|
| 4,947,225 A * | 8/1990 | Custode | 257/526 |
| 5,086,324 A | 2/1992 | Hagino | |
| 5,171,696 A | 12/1992 | Hagino | |
| 5,808,352 A | 9/1998 | Sakamoto | |
| 6,054,748 A | 4/2000 | Tsukuda et al. | |
| 6,504,184 B2 * | 1/2003 | Alok | 257/151 |
| 6,541,346 B2 * | 4/2003 | Malik | 438/316 |
| 2005/0017290 A1 | 1/2005 | Takahashi et al. | |
| 2005/0058913 A1 * | 3/2005 | Osada et al. | 430/5 |
| 2005/0258493 A1 | 11/2005 | Aono et al. | |
| 2007/0080407 A1 | 4/2007 | Kono | |
| 2007/0158680 A1 | 7/2007 | Ozeki et al. | |
| 2008/0258172 A1 | 10/2008 | Takahashi et al. | |

(Continued)

FOREIGN PATENT DOCUMENTS

JP    2-126682 A    5/1990

(Continued)

OTHER PUBLICATIONS

Office Action issued on Mar. 28, 2012 in U.S. Appl. No. 13/242,960.

(Continued)

*Primary Examiner* — Seahvosh Nikmanesh
*Assistant Examiner* — Evren Seven
(74) *Attorney, Agent, or Firm* — Kenyon & Kenyon LLP

(57) ABSTRACT

Provided is a method of manufacturing a semiconductor device capable of preventing a relative displacement of the positions between a range where impurity ions are injected and a range where charged particles are injected. The method of manufacturing the semiconductor device includes: irradiating impurity ions in a state in which a mask is disposed between an impurity ion irradiation apparatus and a semiconductor substrate; and irradiating charged particles to form a short carrier lifetime region, in a state in which the mask is disposed between a charged particle irradiation apparatus and the semiconductor substrate. A relative positional relationship between the mask and the semiconductor substrate is not changed from a beginning of one of the irradiating the impurity ions and the irradiating the charged particles to a completion of both of the irradiating the impurity ions and the irradiating the charged particles.

6 Claims, 16 Drawing Sheets

U.S. PATENT DOCUMENTS

| | | |
|---|---|---|
| 2009/0278166 A1 | 11/2009 | Soeno et al. |
| 2010/0009551 A1* | 1/2010 | Inoue .......................... 438/798 |
| 2010/0140658 A1* | 6/2010 | Koyama et al. ............... 257/140 |
| 2011/0193132 A1 | 8/2011 | Kouno et al. |
| 2012/0007141 A1 | 1/2012 | Soeno |

FOREIGN PATENT DOCUMENTS

| | | |
|---|---|---|
| JP | 04-214674 A | 8/1992 |
| JP | 07-135214 A | 5/1995 |
| JP | 8-227895 A | 9/1996 |
| JP | 10-041510 A | 2/1998 |
| JP | 10-321877 A | 12/1998 |
| JP | 2005-057235 A | 3/2005 |
| JP | 2005-317751 A | 11/2005 |
| JP | 2007-103770 A | 4/2007 |
| JP | 2008-004866 A | 1/2008 |
| JP | 2008-004867 A | 1/2008 |
| JP | 2008-047565 A | 2/2008 |
| JP | 2008-192737 A | 8/2008 |
| JP | 2008-211148 A | 9/2008 |
| JP | 2008-235405 A | 10/2008 |
| JP | 2009-170670 A | 7/2009 |
| JP | 2009-272550 A | 11/2009 |
| WO | 2009065606 | 7/2009 |
| WO | 2011/027473 A1 | 3/2011 |
| WO | 2011/030454 A1 | 3/2011 |

OTHER PUBLICATIONS

Translation of International Preliminary Report on Patentability of PCT/JP2009/065606 issued Nov. 5, 2010.

International Search Report of PCT/JP2009/070911 mailed Mar. 16, 2010 & Written Opinion.

International Search Report of PCT/JP2009/065606 mailed Dec. 8, 2009 & Written Opinion.

International Preliminary Report on Patentability of PCT/JP2009/065606 issued Nov. 5, 2010.

Translation of International Preliminary Report on Patentability of PCT/JP2009/070911 issued Aug. 1, 2012.

* cited by examiner

METHOD OF MANUFACTURING SEMICONDUCTOR DEVICE

CROSS-REFERENCE TO RELATED APPLICATION

This application is a continuation of PCT application serial no. PCT/JP2009/070911 filed on Dec. 15, 2009, which PCT application designates the United States of America, and contents of which are hereby incorporated by reference.

FIELD

The technology disclosed in the present specification relates to a method of manufacturing a semiconductor device.

DESCRIPTION OF RELATED ART

There is known technology for forming crystal defects in a semiconductor substrate by injecting charged particles such as helium ions into the semiconductor substrate. The region in which the crystal defects are formed becomes a short lifetime region with a short carrier lifetime. For example, in a semiconductor device of Japanese Patent Application Publication No. 2008-192737 ("Patent Literature 1" hereinafter) in which IGBT and a diode are integrated, a short lifetime region is formed in the drift region of the diode. The formation of the short lifetime region in the drift region of the diode can improve the reverse recovery characteristic of the diode.

BRIEF SUMMARY

A semiconductor device with the short lifetime region is manufactured by a conventional manufacturing method as follows. Specifically, a patterned resist layer is formed on a surface of a semiconductor substrate, and then n-type impurity ions or p-type impurity ions are injected into the semiconductor substrate (impurity ion injecting step). As a result, an n-type semiconductor region or a p-type semiconductor region is formed in a region on the semiconductor substrate that is not covered by the resist layer. The resist layer is removed subsequent to the impurity ion injecting step. Next, charged particles are irradiated from a charged particle irradiation apparatus to the semiconductor substrate in a state in which a mask plate is disposed between the charged particle irradiation apparatus and the semiconductor substrate (charged particle injecting step). The mask plate has an opening portion or a thin portion. The irradiated charged particles are injected into the semiconductor substrate through the opening portion or the thin portion. Consequently, a short lifetime region is formed in the semiconductor substrate. In the aforementioned semiconductor device of Patent Literature 1, for example, a cathode region (n+ region) of the diode is formed by the impurity ion injecting step, and the short lifetime region of the diode is formed by the charged particle injecting step.

When manufacturing the aforementioned semiconductor device of Patent Literature 1, the cathode region is formed by injecting the n-type impurity ions into a vicinity of the surface of the semiconductor substrate within a predetermined range. Also, the short lifetime region is formed by injecting the charged particles into a deeper position within the same range as the range where the n-type impurity ions are injected. When the relative position of the short lifetime region and the cathode region (the position along the direction parallel to the surface of the semiconductor substrate) varies from a designed value, the characteristics of the semiconductor device vary from the designed value. For instance, when the position of the short lifetime region is displaced from the designed value toward the IGBT side (i.e., when crystal defects are formed within the drift region of the IGBT), the on-voltage of the IGBT increases. When the short lifetime region is displaced from the designed value toward the diode side, the reverse current, which is generated upon reverse recovery of the diode, becomes larger since the reverse current can easily flow by bypassing the short lifetime region.

In the conventional manufacturing method described above, because the mask (resist layer) used in the impurity ion injecting step is different from the mask (mask plate) used in the charged particle injecting step, the relative position of the range where the impurity ions are injected and the range where the charged particles are injected can be varied. When the position of the range where the impurity ions are injected and the position of the range where the charged particles are injected are displaced from each other upon mass production of the semiconductor device, the characteristics of the semiconductor device become unstable.

The technique disclosed in the present specification was created in view of the circumstances described above. The technique disclosed in the present specification provides a method of manufacturing a semiconductor device capable of preventing a relative displacement of the positions between a range where impurity ions are injected and a range where charged particles are injected.

The manufacturing method provided by the present specification comprises irradiating impurity ions and irradiating charged particles. In the irradiating the impurity ions, n-type or p-type impurity ions are irradiated from an impurity ion irradiation apparatus to a semiconductor substrate in a state in which a mask is disposed between the impurity ion irradiation apparatus and the semiconductor substrate. The mask is a either a mask comprising a first portion having a small thickness and a second portion thicker than the first portion or a mask comprising a first portion configured by a penetrating hole and a second portion having a predetermined thickness. Accordingly, the impurity ions passing through the first portion are injected into the semiconductor substrate. In the irradiating the charged particles, the charged particles are irradiated from a charged particle irradiation apparatus to the semiconductor substrate in a state in which the mask used in the irradiating the impurity ions is disposed between the charged particle irradiation apparatus and the semiconductor substrate. Accordingly the charged particles passing through at least one of the first portion and the second portion are injected into the semiconductor substrate, and a short carrier lifetime region in which a carrier lifetime is shortened is formed in the semiconductor substrate within a range in which the charged particles are injected. A positional relationship between the mask and the semiconductor substrate is not changed from a beginning of one of the irradiating the impurity ions and the irradiating the charged particles to a completion of both of the irradiating the impurity ions and the irradiating the charged particles.

Note that the irradiating the charged particles may be executed subsequent to the irradiating the impurity ions, or the irradiating the impurity ions may be executed subsequent to the irradiating the charged particles. In addition, the term "inject" in the present specification means that the impurity ions or charged particles that are irradiated toward the semiconductor substrate stop inside the semiconductor substrate. Thus, the passing (penetration) of the impurity ions or charged particles through the semiconductor substrate does not fall under the meaning of the term "inject."

In this manufacturing method, the irradiating the impurity ions and the irradiating the charged particles are executed using the same mask, and a positional relationship between the mask and the semiconductor substrate is not changed between the irradiating the impurity ions and the irradiating the charged particles. Therefore, the offset of the positions between the range where the impurity ions are injected and the range where the charged particles are injected is prevented. As a result, the semiconductor device can be mass-produced with a stable quality.

DETAILED DESCRIPTION OF THE PREFERRED EMBODIMENT

Figure 1:
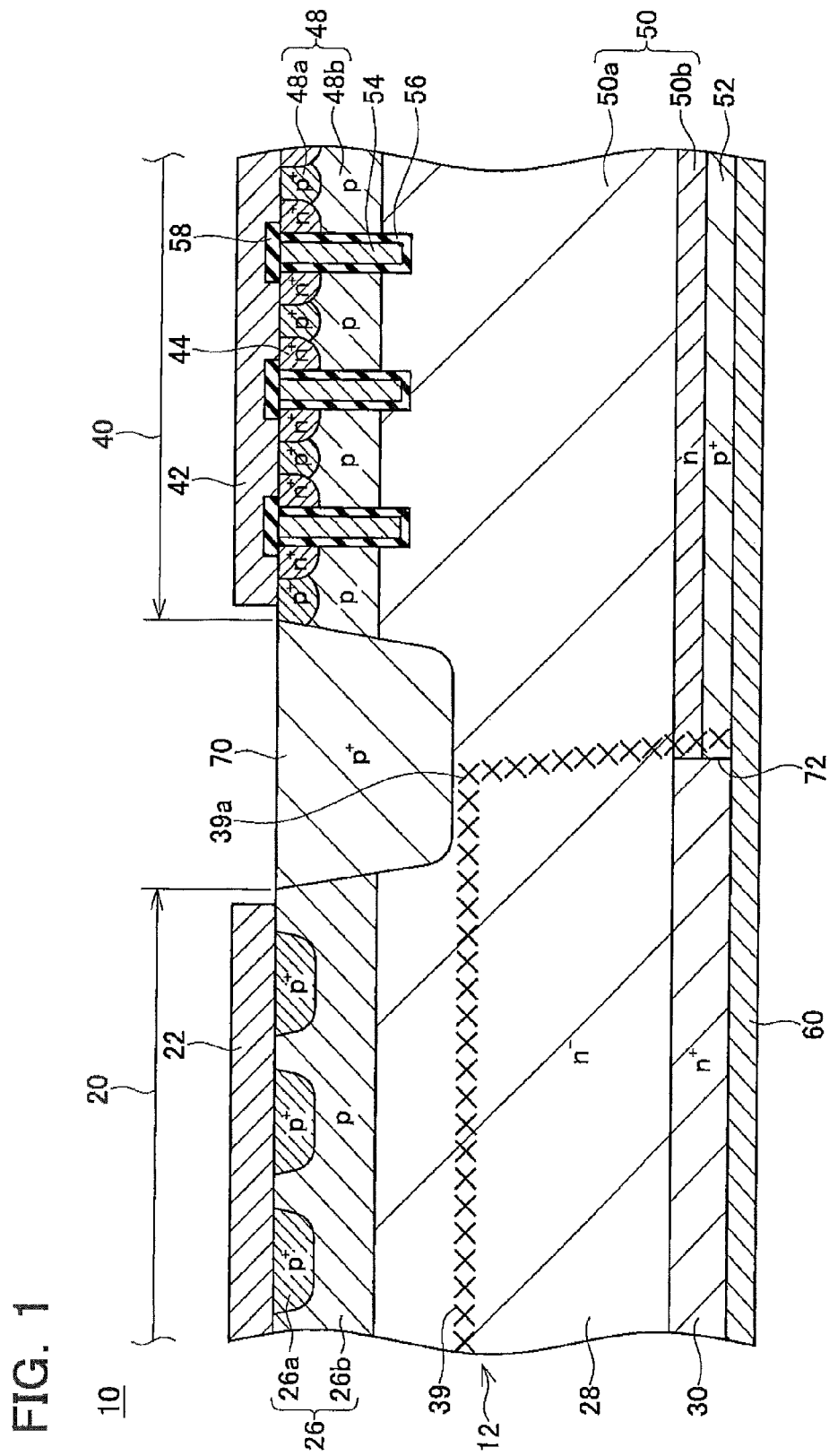
FIG. 1 is a cross-sectional diagram of a semiconductor device 10 manufactured by a manufacturing method according to a first embodiment.

The above mentioned manufacturing method provided by the present specification may manufacture a vertical semiconductor device including an IGBT and a diode. In the irradiating the impurity ions, the n-type impurity ions passing through the first portion may be injected into a region corresponding to a cathode region of the diode. In the irradiating the charged particles, the charged particles passing through the first portion may be injected into a region corresponding to a drift region of the diode.

According to this configuration, the short carrier lifetime region can be formed in a region that substantially coincides with the cathode region when the semiconductor substrate is planarly viewed. Accordingly, the characteristics among the diodes and the IGBTs do not vary greatly upon mass-producing the semiconductor devices.

According to any of the manufacturing methods described above, in the irradiating the impurity ions, the impurity ions irradiated to the second portion of the mask may stop in the mask. In the irradiating the charged particles, the charged particles irradiated to the first portion of the mask may pass through the first portion and be injected into the semiconductor substrate, and the charged particles irradiated to the second portion of the mask may stop in the mask.

According to any of the manufacturing methods described above, in the irradiating the impurity ions, the impurity ions irradiated to the second portion of the mask may stop in the mask. In the irradiating the charged particles, the charged particles irradiated to the first portion of the mask may pass through the first portion and be injected into the semiconductor substrate, and the charged particles irradiated to the second portion of the mask may pass through the second portion and be injected into the semiconductor substrate.

When the charged particles irradiated to the second portion of the mask pass through the second portion, the charged particles are also injected into the semiconductor substrate within the range corresponding to the second portion of the mask. However, compared to the charged particles passing through the first portion, the charged particles passing through the second portion lose a lot of energy when passing through the mask. Therefore, the position within the semiconductor substrate where the charged particles passing through the second portion stop is shallower than a position within the semiconductor substrate where the charged particles passing through the first portion stop. For this reason, this manufacturing method can form the short carrier lifetime region at a deep position in the semiconductor substrate within the range corresponding to the first portion, and the short carrier lifetime region at a shallow position in the semiconductor substrate within the range corresponding to the second portion. Additionally, according to this manufacturing method, the irradiated charged particles pass through the mask within both of the first portion and the second portion. Because the charged particles do not stop in the first portion and the second portion, the mask is less subject to damage. Accordingly, the durability of the mask can be kept high.

Moreover, the manufacturing method described above may be configured as follows, when manufacturing a vertical semiconductor device including an IGBT and a diode. In the irradiating the impurity ions, the p-type impurity ions passing through the first portion are injected into a region corresponding to a collector region of the IGBT. In the irradiating the charged particles, the charged particles passing through the second portion are injected into a region corresponding to a drift region of the diode.

According to such a configuration, the short carrier lifetime region can be accurately formed in a range that does not overlap with the collector region when the semiconductor substrate is planarly viewed. Accordingly, the characteristics among the diodes and the IGBTs do not vary greatly upon mass-producing the semiconductor devices.

According to the manufacturing methods provided by the present specification, in the irradiating impurity ions, the impurity ions irradiated to the second portion of the mask may stop in the mask. In the irradiating the charged particles, the charged particles irradiated to the first portion of the mask may pass through the mask and the semiconductor substrate, and the charged particles irradiated to the second portion of the mask may pass through the second portion and be injected into the semiconductor substrate.

According to such a configuration, because the charged particles pass through the semiconductor substrate within the range corresponding to the first portion of the mask, the short carrier lifetime region is not formed in the semiconductor substrate within the range corresponding to the first portion of the mask. On the other hand, the charged particles are injected into the semiconductor substrate within the range corresponding to the second portion of the mask. For this reason, the short carrier lifetime region can be formed selectively in the semiconductor substrate within the range corresponding to the second portion. Furthermore, in this manufacturing method, the charged particles irradiated to both the first portion and the second portion pass through the mask. Because the charged particles do not stop within the first portion and the second portion, the mask is less subject to damage. Accordingly, the durability of the mask can be kept high.

Any of the manufacturing methods described above may further include fixing the mask to the semiconductor substrate. The irradiating the impurity ions and the irradiating the charged particles can be carried out after the fixing the mask.

First Embodiment

A method of manufacturing a semiconductor device according to a first embodiment is now described. The manufacturing method according to the first embodiment manufactures a semiconductor device 10 shown in FIG. 1.
(Structure of the Semiconductor Device)

As shown in FIG. 1, the semiconductor device 10 has a semiconductor substrate 12, and a metal layer and insulating layer that are formed, respectively, on an upper surface and a lower surface of the semiconductor substrate 12. A diode region 20 and an IGBT region 40 are formed in the semiconductor substrate 12.

An anode electrode 22 is formed within the diode region 20 on the upper surface of the semiconductor substrate 12. An emitter electrode 42 is formed within the IGBT region 40 on the upper surface of the semiconductor substrate 12. A common electrode 60 is formed on the lower surface of the semiconductor substrate 12.

An anode layer 26, diode drift layer 28, and cathode layer 30 are formed in the diode region 20.

The anode layer 26 is made of a p-type semiconductor. The anode layer 26 comprises anode contact regions 26a and a low concentration anode layer 26b. The anode contact regions 26a are formed in the island shape in a range exposed on the upper surface of the semiconductor substrate 12. The anode contact regions 26a have a high impurity concentration. The anode contact regions 26a are ohmically connected to the anode electrode 22. The low concentration anode layer 26b is formed under and beside the anode contact regions 26a so as to cover the anode contact regions 26a. The impurity concentration of the low concentration anode layer 26b is lower than that of the anode contact regions 26a.

The diode drift layer 28 is formed under the anode layer 26. The diode drift layer 28 is made of an n-type semiconductor and has a low impurity concentration.

The cathode layer 30 is formed under the diode drift layer 28. The cathode layer 30 is formed in a range exposed on the lower surface of the semiconductor substrate 12. The cathode layer 30 is made of an n-type semiconductor and has a high impurity concentration. The cathode layer 30 is ohmically connected to the common electrode 60.

The anode layer 26, the diode drift layer 28 and the cathode layer 30 form diode.

Emitter regions 44, body layer 48, IGBT drift layer 50, collector layer 52 and gate electrodes 54 are formed in the IGBT region 40.

A plurality of trenches is formed on the upper surface of the semiconductor substrate 12 within the IGBT region 40. A gate insulator film 56 is formed on an inner surface of each of the trenches. The gate electrodes 54 are formed within the respective trenches. Upper surfaces of the gate electrodes 54 are covered with insulator films 58. The gate electrodes 54 are insulated from the emitter electrode 42.

The emitter regions 44 are formed in the island shape in a range exposed on the upper surface of the semiconductor substrate 12. The emitter regions 44 are formed in a range in contact with the gate insulator film 56. The emitter regions 44 are made of an n-type semiconductor and have a high impurity concentration. The emitter regions 44 are ohmically connected to the emitter electrode 42.

The body layer 48 is made of a p-type semiconductor. The body layer 48 has body contact regions 48a and a low concentration body layer 48b. The body contact regions 48a are formed in the island shape in ranges exposed on the upper surface of the semiconductor substrate 12. The body contact region 48a is found between two of the emitter regions 44. The body contact regions 48a have a high impurity concentration. The body contact regions 48a are ohmically connected to the emitter electrode 42. The low concentration body layer 48b is formed under the emitter regions 44 and the body contact regions 48a. The impurity concentration of the low concentration body layer 48b is lower than that of the body contact regions 48a. The emitter regions 44 are separated from the IGBT drift layer 50 by the low concentration body layer 48b. The gate electrodes 54 face, via the gate insulator film 56, the low concentration body layer 48b within the range separating the emitter regions 44 from the IGBT drift layer 50.

The IGBT drift layer 50 is formed under the body layer 48. The IGBT drift layer 50 is made of an n-type semiconductor. The IGBT drift layer 50 has a drift layer 50a and a buffer layer 50b. The drift layer 50a is formed under the body layer 48. The drift layer 50a has a low impurity concentration. The drift layer 50a has substantially the same impurity concentration as the diode drift layer 28, and continues with the diode drift layer 28. The buffer layer 50b is found under the drift layer 50a. The impurity concentration of the buffer layer 50b is higher than that of the drift layer 50a.

The collector layer 52 is formed under the IGBT drift layer 50. The collector layer 52 is formed in a range exposed on the lower surface of the semiconductor substrate 12. The collector layer 52 is made of a p-type semiconductor and has a high impurity concentration. The collector layer 52 is ohmically connected to the common electrode 60.

The emitter regions 44, the body layer 48, the IGBT drift layer 50, the collector layer 52, and the gate electrodes 54 form IGBT.

A separation region 70 is formed between the diode region 20 and the IGBT region 40. The separation region 70 is formed in a range extending from the upper surface of the semiconductor substrate 12 to a position deeper than a lower end of the anode layer 26 and a lower end of the body layer 48.

More specifically, the separation region 70 is formed in a range extending from the upper surface of the semiconductor substrate 12 to a position deeper than a lower end of the gate electrodes 54. The separation region 70 is in contact with the anode layer 26 and the body layer 48. The separation region 70 is made of a p-type semiconductor. The impurity concentration of the separation region 70 is higher than those of the low concentration anode layer 26b and the low concentration body layer 48b.

The diode drift layer 28 continues to the drift layer 50a under the separation region 70. The cathode layer 30 of the diode region 20 extends to a position right below the separation region 70, and the collector layer 52 of the IGBT region 40 extends to a position right below the separation region 70. The cathode layer 30 is in contact with the collector layer 52 right below the separation region 70. In other words, a boundary 72 between the cathode layer 30 and the collector layer 52 is located right below the separation region 70. A cross-sectional structure of a boundary section shown in FIG. 1 is provided between the diode region 20 and the IGBT region 40. Specifically, the boundary 72 extends along the separation region 70 between the diode region 20 and the IGBT region 40.

A diode short carrier lifetime region 39 is formed within the diode drift layer 28. Within the diode short carrier lifetime region 39, crystal defects are formed by injecting charged particles in the semiconductor substrate 12. The crystal defect density within the diode short carrier lifetime region 39 is extremely higher than that of the surrounding diode drift layer 28. The diode short carrier lifetime region 39 is formed at a depth close to the anode layer 26 and deeper than a lower end of the separation region 70. Reference numeral 39a represents an end portion of the diode short carrier lifetime region 39 on the IGBT region 40 side. The crystal defects are distributed toward the lower surface side of the semiconductor substrate 12 (downward in FIG. 1) outside the end portion 39a (on the IGBT region 40 side). This is because the depth of injecting the charged particles changes in the vicinity of the outer circumference of a penetrating hole (opening) of the mask. The density of the crystal defects distributed along the depth direction is low and therefore has almost no influence on the characteristics of the semiconductor device 10.

(Operations of the Diode of the Semiconductor Device)

Operations of the diode of the semiconductor device 10 are now described. If a voltage (a forward voltage) is applied between the anode electrode 22 and the common electrode 60 to make the anode electrode 22 positive, the diode is turned on. In other words, current flows from the anode electrode 22 to the common electrode 60 via the anode layer 26, the diode drift layer 28, and the cathode layer 30.

When the voltage applied to the diode is switched from the forward voltage to a reverse voltage, the diode performs a reverse recovery operation. In other words, holes that exist within the diode drift layer 28 upon application of the forward voltage is discharged to the anode electrode 22, and electrons that exist within the diode drift layer 28 upon application of the forward voltage are discharged to the common electrode 60. As a result, a reverse current flows to the diode. The reverse current attenuates within a short amount of time, and thereafter the current flowing to the diode becomes approximately zero. The crystal defects within the diode short carrier lifetime region 39 function as a carrier recombination center. Therefore, most of the carriers within the diode drift layer 28 are vanished due to recombination within the diode short carrier lifetime region 39, when the reverse recovery operation is performed. For this reason, the reverse current that is generated upon reverse recovery is suppressed in the semiconductor device 10.

(Operations of the IGBT of the Semiconductor Device)

Operations of the IGBT of the semiconductor device 10 are now described. If a voltage is applied between the emitter electrode 42 and the common electrode 60 to make the common electrode 60 positive, and an on-potential (which is equal to or higher than a potential required for forming a channel) is applied to the gate electrodes 54, the IGBT is turned on. In other words, application of the on-potential to the gate electrodes 54 forms channels in the low concentration body layers 48b within respective ranges in contact with the gate insulator film 56. Consequently, the electrons flow from the emitter electrode 42 to the common electrode 60 via the emitter regions 44, the channels, the IGBT drift layer 50, and the collector layer 52. In addition, the holes flow from the common electrode 60 to the emitter electrode 42 via the collector layer 52, the IGBT drift layer 50, the low concentration body layer 48b, and the body contact regions 48a. Specifically, current flows from the common electrode 60 to the emitter electrode 42.

When the potential applied to the gate electrodes 54 is switched from the on-potential to an off-potential, the IGBT is turned off. In other words, the holes that exist within the IGBT drifts layer 50 when the IGBT is turned on is discharged to the common electrode 60, and the electrons that exist within the IGBT drift layer 50 when the IGBT is turned on are discharged to the emitter electrode 42. As a result, a reverse current flows to the IGBT. The reverse current attenuates within a short amount of time, and thereafter the current flowing to the IGBT becomes approximately zero.

In the semiconductor device 10 of the first embodiment, the end portion 39a of the diode short carrier lifetime region 39 is located substantially immediately above the boundary 72 between the cathode layer 30 and, the collector layer 52. When the position of the end portion 39a is displaced toward the IGBT region 40 side due to a production error, crystal defects are formed within the drift layer 50a in the vicinity of the body layer 48. In this case, because the recombination of the carriers is facilitated within the drift layer 50a when the IGBT is turned on, the on-voltage of the IGBT increases. On the other hand, when the position of the end portion 39a is displaced toward the diode region 20 side due to a production error, the reverse current tends to bypass the diode short carrier lifetime region 39 when the diode performs the reverse recovery operation, and as a result, the reverse current increases.

(Method of Manufacturing the Semiconductor Device 10)

A manufacturing method according to the first embodiment is capable of preventing the displacement of the end portion 39a and the boundary 72. The manufacturing method according to the first embodiment is described next.

Figure 2:
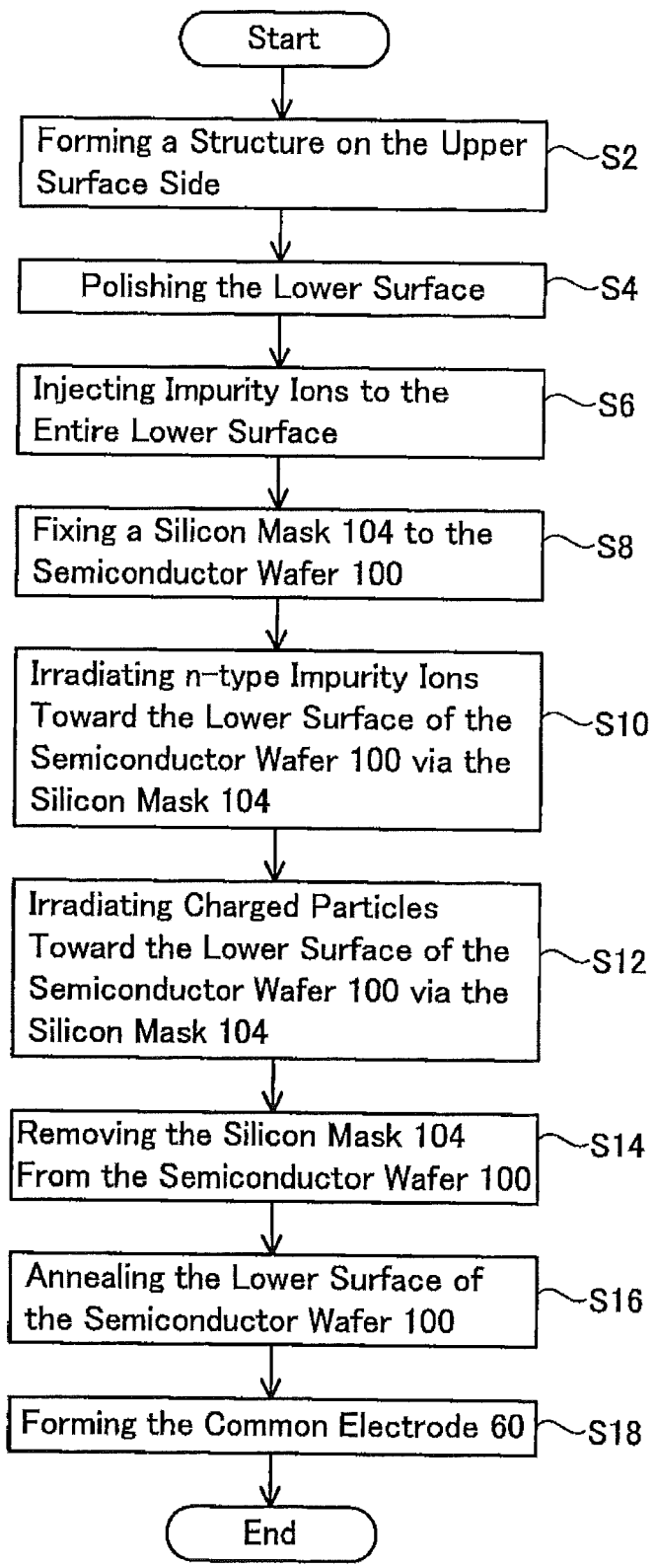
FIG. 2 is a flowchart of the manufacturing method according to the first embodiment.

FIG. 2 is a flowchart of the manufacturing method according to the first embodiment. The semiconductor device 10 is manufactured from a semiconductor wafer ("semiconductor wafer 100" hereinafter) made of silicon containing a low concentration of n-type impurities.

In step S2, a structure on the upper surface side of the semiconductor device 10 (i.e., the anode layer 26, the emitter regions 44, the body layer 48, the separation region 70, the gate electrodes 54, the anode electrode 22, and the emitter electrode 42) is formed in the semiconductor wafer 100. A conventionally known method is used for forming the structure on the upper surface side, and therefore the detailed description thereof is omitted. The formation of the structure on the upper surface side obtains the cross-sectional structure of the semiconductor wafer 100 shown in FIG. 3.

Figure 3:
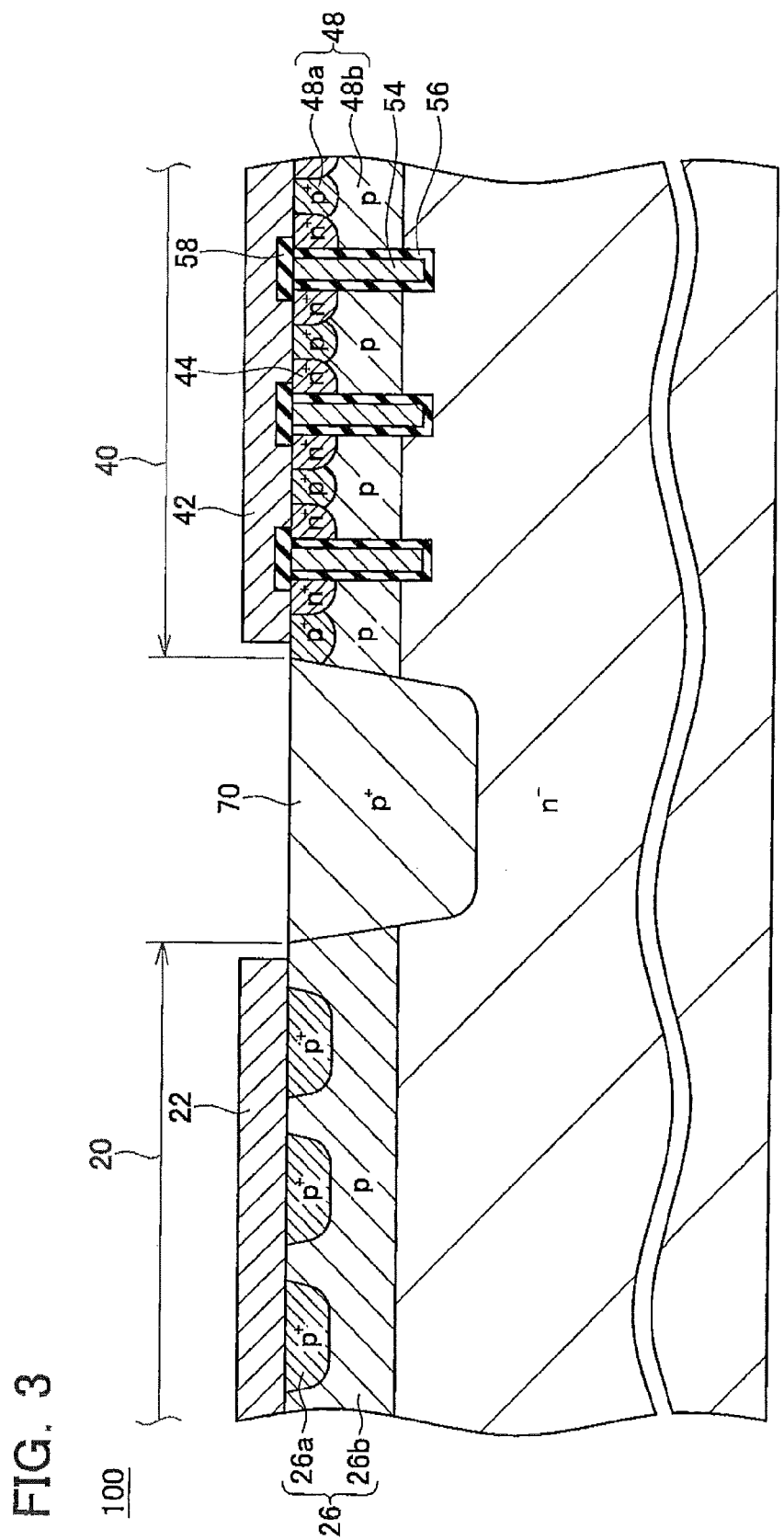
FIG. 3 is an enlarged cross-sectional diagram of a semiconductor wafer 100 obtained after the execution of step S2.
Figure 4:
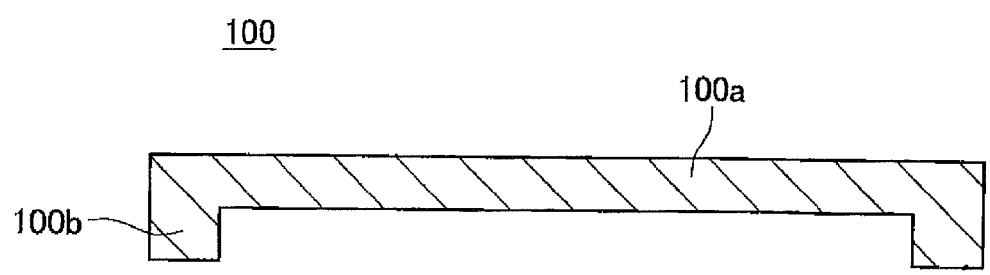
FIG. 4 is a cross-sectional diagram of the semiconductor wafer 100 obtained after the execution of step S4.

In step S4, a concave portion is formed in the center of a lower surface of the semiconductor wafer 100, as shown in FIG. 4, by polishing the center of the lower surface of the semiconductor wafer 100. Accordingly, a central part 100a of the semiconductor wafer 100 is made thinner. The structure shown in FIG. 3 is formed in the central part 100a.

In step S6, n-type impurity ions and p-type impurity ions are injected to the entire lower surface of the central part 100a of the semiconductor wafer 100. When injecting the n-type impurity ions, the irradiation energy of the impurity ions is adjusted so that the n-type impurity ions stop at a depth corresponding to the buffer layer 50b. When injecting the p-type impurity ions, the irradiation energy of the impurity ions is adjusted so that the p-type impurity ions stop at a depth corresponding to the collector layer 52 (i.e., depth near the lower surface of the central part 100a of the semiconductor wafer 100).

Figure 5:
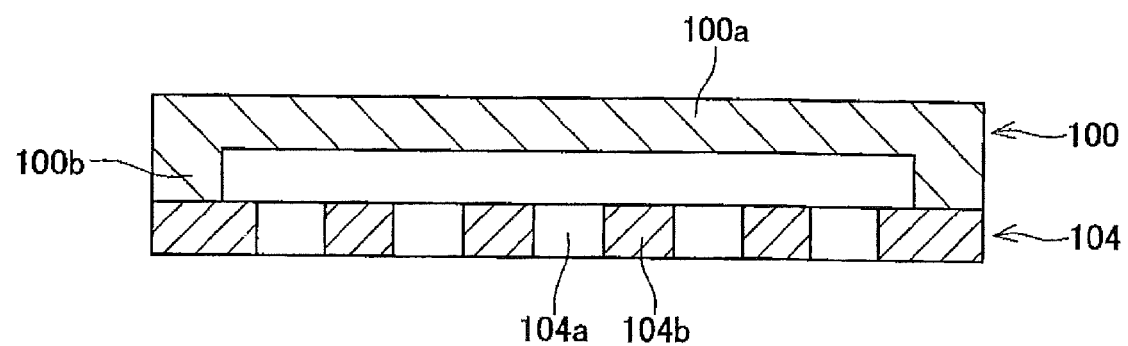
FIG. 5 is a cross-sectional diagram of the semiconductor wafer 100 in which a silicon mask 104 is fixed.
Figure 6:
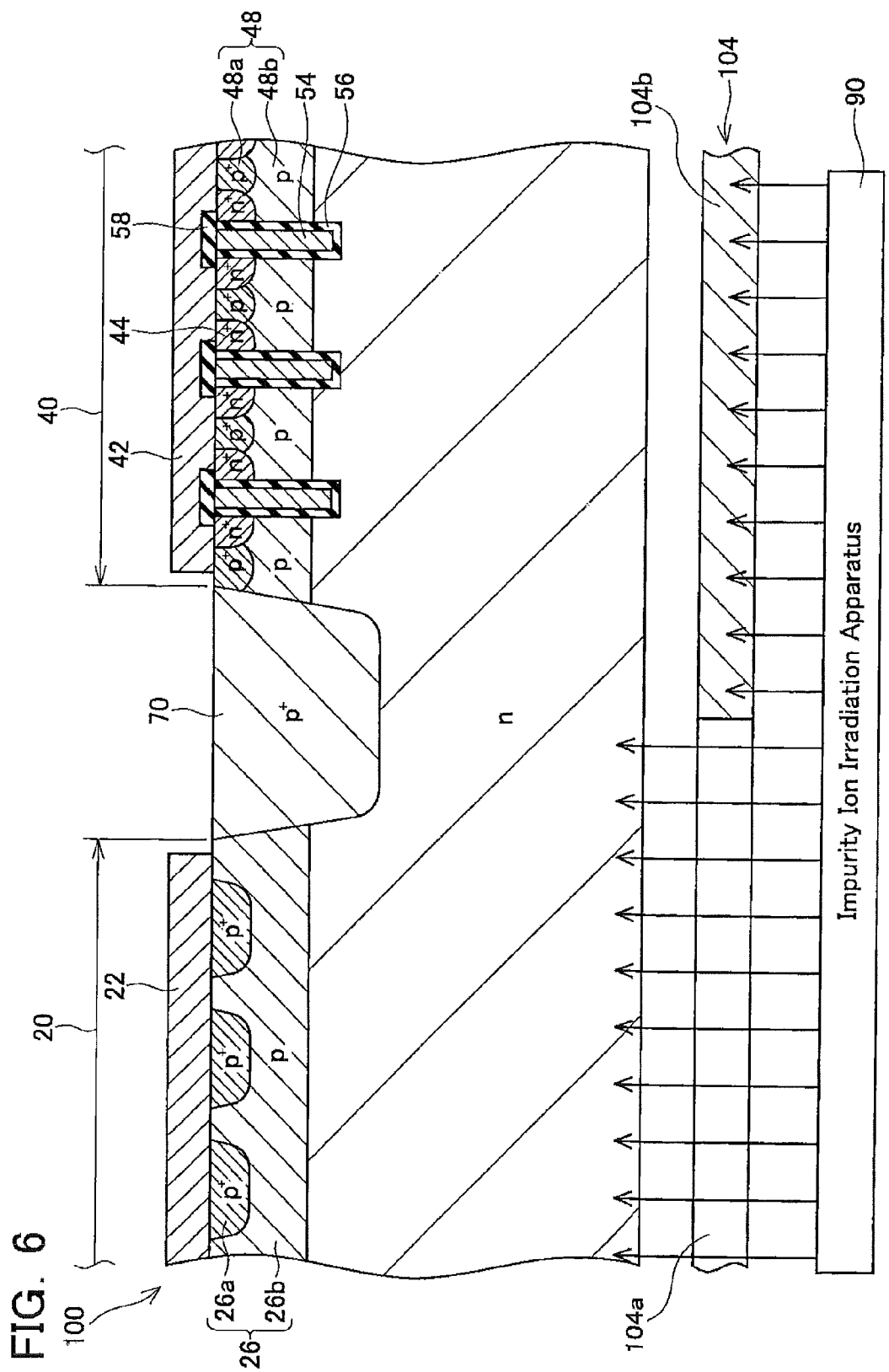
FIG. 6 is an explanatory diagram illustrating a step of selectively injecting n-type impurity ions.

In step S8, a silicon mask 104 is fixed to the lower surface of the semiconductor wafer 100, as shown in FIG. 5. The silicon mask 104 is bonded to a lower surface of an outer circumferential part 100b of the semiconductor wafer 100. Note that penetrating holes 104a are formed in the silicon mask 104. The section other than the penetrating holes 104a in the silicon mask 104 is referred to as a mask portion 104b hereinafter. In step S8, the silicon mask 104 is bonded to the semiconductor wafer 100 while adjusting their positions so that the region where the cathode layer 30 is to be formed coincides with the penetrating holes 104a when the semiconductor wafer 100 is planarly viewed.

In step S10, the n-type impurity ions are irradiated from an impurity ion irradiation apparatus 90 toward the lower surface of the semiconductor wafer 100 on which the silicon mask 104 is bonded. The n-type impurity ions that are irradiated toward the penetrating holes 104a pass through the penetrating holes 104a and are injected to the lower surface of the central part 100a of the semiconductor wafer 100. In other words, the n-type impurity ions are injected to the range where the cathode layer 30 is to be formed. In step S10, the irradiation energy of the impurity ions is adjusted so that the n-type impurity ions that pass through the penetrating holes 104a stop at a depth corresponding to the cathode layer 30 (i.e., the depth near the lower surface of the central part 100a of the semiconductor wafer 100). On the other hand, the n-type impurity ions irradiated toward the mask portion 104b stop within the mask portion 104b. Therefore, the n-type impurity ions are injected only to the range corresponding to the penetrating holes 104a on the lower surface of the central part 100a of the semiconductor wafer 100 (the range where the cathode layer 30 is to be formed). In step S10, the n-type impurity ions are injected at the concentration higher than that of the p-type impurity ions which are injected to the semiconductor wafer 100 in step S6.

Figure 7:
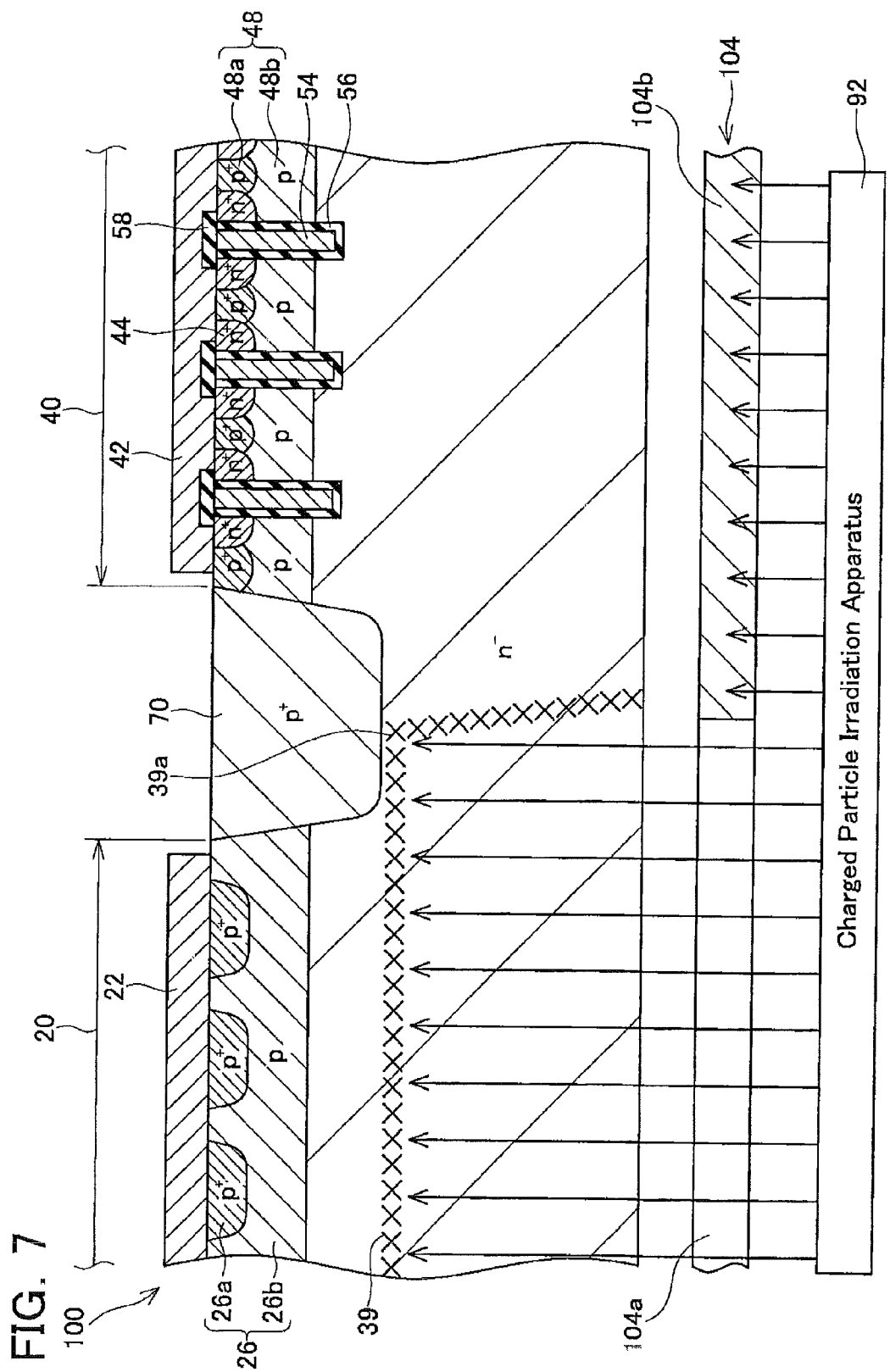
FIG. 7 is an explanatory diagram illustrating a step of selectively injecting charged particles.

In step S12, as shown in FIG. 7, charged particles (helium ions in the present embodiment) are irradiated from a charged particle irradiation apparatus 92 toward the lower surface of the semiconductor wafer 100 on which the silicon mask 104 is bonded. Step S12 is executed without changing the relative positional relationship between the silicon mask 104 and the semiconductor wafer 100 from the relative positional relationship in step S10. The charged particles irradiated toward the penetrating holes 104a pass through the penetrating holes 104a and are injected to the lower surface of the central part 100a of the semiconductor wafer 100. In other words, the charged particles are injected to the same range as the range to which the n-type impurity particles are injected in step S10 (the range in the in-plane direction of the semiconductor wafer 100). In step S12, the irradiation energy of the charged particles is adjusted so that the charged particles passing through the penetrating holes 104a stop at a depth corresponding to the diode short carrier lifetime region 39. On the other hand, the charged particles irradiated toward the mask portion 104b stop within the mask portion 104b. Therefore, the charged particles are injected only to the range corresponding to the penetrating holes 104a on the lower surface of the central part 100a of the semiconductor wafer 100. The injected charged particles form crystal defects in the vicinity of the stop position. As a result, the diode short carrier lifetime region 39 is formed in the semiconductor wafer 100.

In step S14, the silicon mask 104 is removed from the semiconductor wafer 100.

In step S16, the lower surface of the semiconductor wafer 100 is locally heated using a laser anneal apparatus. As a result, the impurity ions injected in steps S6 and S10 are activated, and the cathode layer 30, the collector layer 52, and the buffer layer 50b are formed, as shown in FIG. 1. In other words, because the concentration of the n-type impurity ions injected in step S10 is higher than the concentration of the p-type impurity ions injected in step S6, the region where the n-type impurity ions are injected in step S10 becomes an n-type cathode region by the activation of the impurity ions. The region where the p-type impurity ions are injected in step S6 and the n-type impurity ions are not injected in step S10 (the region masked by the mask portions 104b) becomes a p-type collector region by the activation of the impurity ions. Moreover, the region within the IGBT region 40 where the n-type impurity ions are injected in step S6 becomes an n-type buffer layer 50b by the activation of the impurity ions.

In step S18, the common electrode 60 is formed on the lower surface of the central part 100a of the semiconductor wafer 100. Subsequent to step S18, the semiconductor wafer 100 is subjected to dicing to complete the semiconductor device 10.

As described above, steps S10 and S12 are executed without changing the relative positional relationship between the semiconductor wafer 100 and the silicon mask 104. Therefore, the range where the n-type impurity ions are injected in step S10 substantially coincides with the range where the charged particles are injected in step S12. Specifically, the relative offset of the positions between the diode short carrier lifetime region 39 and the cathode layer 30 is prevented. In other words, the semiconductor device 10 can be manufactured so that the end portion 39a of the diode short carrier lifetime region 39 is located substantially immediately above the boundary 72 between the cathode layer 30 and the collector layer 52. Thus, mass production of the semiconductor devices 10 using this manufacturing method can prevent fluctuation of the on-voltage among the IGBTs, as well as fluctuation of the reverse recovery characteristics among the diodes.

Second Embodiment

Figure 8:
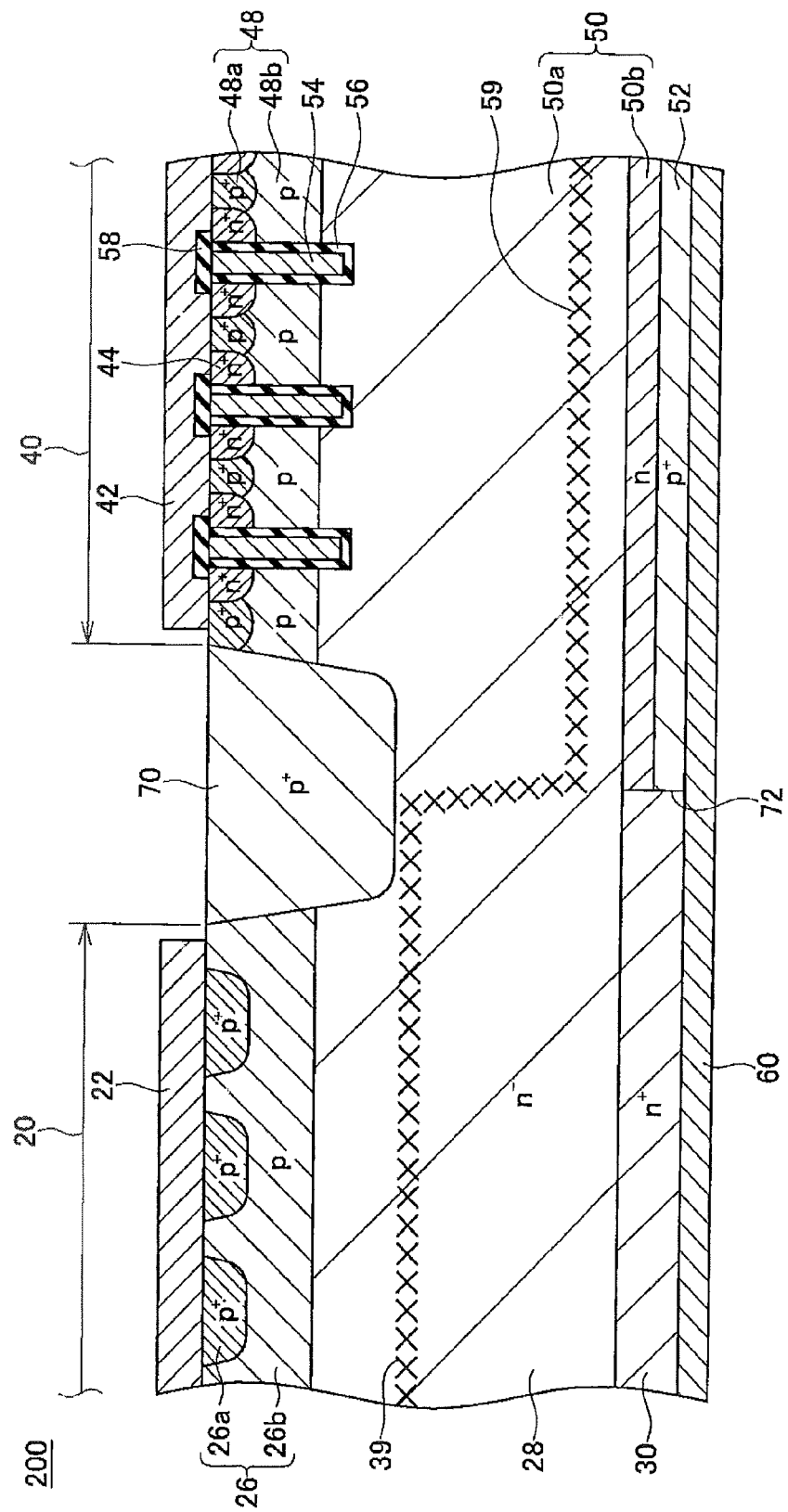
FIG. 8 is a cross-sectional diagram of a semiconductor device 200 manufactured by a manufacturing method according to a second embodiment.

A method of manufacturing a semiconductor device according to a second embodiment is then described. FIG. 8 shows a semiconductor device 200 manufactured by the manufacturing method according to the second embodiment. As shown in FIG. 8, an IGBT short carrier lifetime region 59 is formed in the drift layer 50a of the semiconductor device 200 according to the second embodiment. The IGBT short carrier lifetime region 59 is a region where crystal defects are formed by the injection of the charged particles. The carrier lifetime of the IGBT short carrier lifetime region 59 is shorter than that of the surrounding drift layer 50a. The IGBT short carrier lifetime region 59 is formed within the drift layer 50a in the vicinity of the buffer layer 50b. Because the IGBT short carrier lifetime region 59 is formed within the drift layer 50a in the vicinity of the buffer layer 50b, the carriers can recombine easily within the drift layer 50a when the IGBT is turned off. Therefore, the reverse current that is generated when the IGBT is turned off can be suppressed, and the speed of turning the IGBT off is improved. The rest of the structure of the semiconductor device 200 according to the second embodiment is the same as that of the semiconductor device 10 of the first embodiment.

Figure 9:
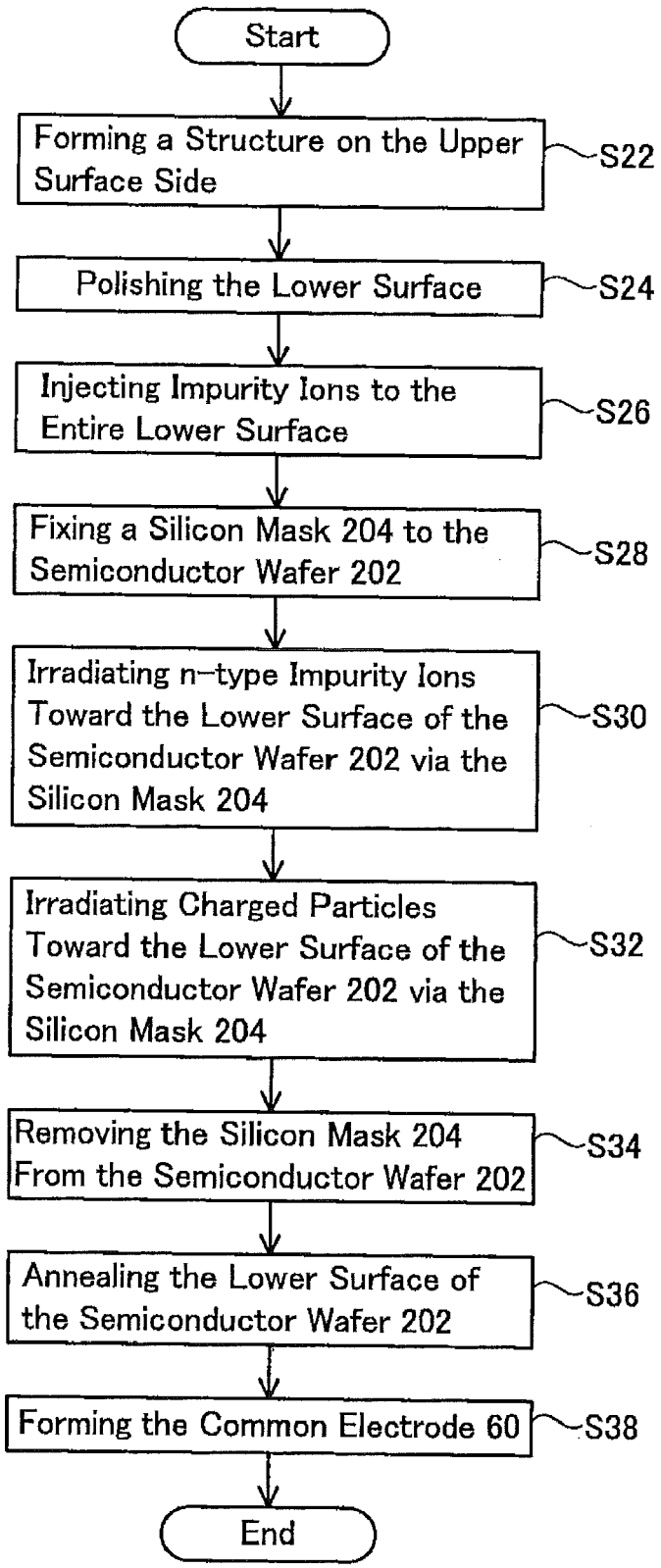
FIG. 9 is a flowchart of the manufacturing method according to the second embodiment.
Figure 10:
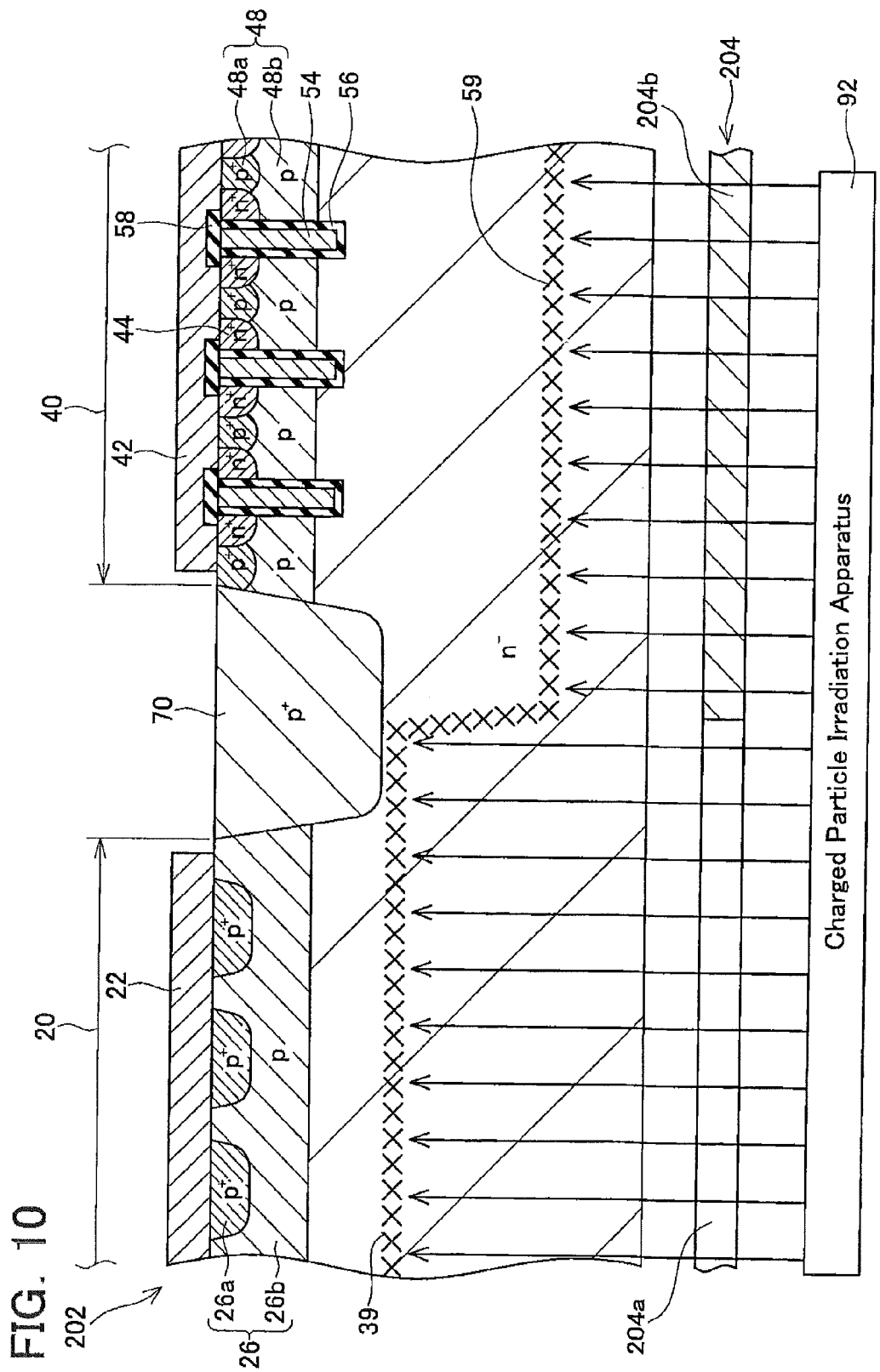
FIG. 10 is an explanatory diagram illustrating a step of injecting charged particles using the manufacturing method according to the second embodiment.

Next, the method of manufacturing the semiconductor device 200 according to the second embodiment is described. FIG. 9 is a flowchart of the manufacturing method according to the second embodiment. Steps S22 to S30 shown in FIG. 9 are executed in a substantially same manner as steps S2 to S10 of the manufacturing method according to the first embodiment. In step S32, charged particles are irradiated from the charged particle irradiation apparatus 92 toward a lower surface of the semiconductor wafer 202 on which a silicon mask 204 is bonded, as shown in FIG. 10. Note that step S32 is executed without changing the positional relationship between the silicon mask 204 and the semiconductor wafer 202 from the positional relationship in step S30. Furthermore, a mask portion 204b of the silicon mask 204 used in the second embodiment is thinner than the mask portion 104b of the silicon mask 104 used in the first embodiment. In step S32, the irradiation energy of the charged particles is adjusted so that the charged particles passing through penetrating holes 204a stop at a depth of the diode short carrier lifetime region 39. The thickness of the mask portion 204b of the silicon mask 204 is adjusted such that the charged particles, irradiated toward the mask portion 204b, penetrate (pass through) the mask portion 204b and then stop at a depth of the IGBT short carrier lifetime region 59 of the semiconductor wafer 202. Therefore, the diode short carrier lifetime region 39 is formed in the diode region 20, and the IGBT short carrier lifetime region 59 is formed in the IGBT region 40.

Steps S34 to S38 are executed in a substantially same manner as steps S14 to S18 of the first embodiment. As a result thereof, the semiconductor device 200 is completed.

As described above, according to the manufacturing method of the second embodiment, the mask portion 204b of the silicon mask 204 is made in a thickness that is enough for allowing the penetration of the charged particles. Thus, the charged particles passing through the mask portion 204b are injected to the IGBT region 40, whereby the IGBT short carrier lifetime region 59 is formed. In step S32, the diode short lifetime region 39 and the IGBT short lifetime region 59 can be formed simultaneously. Because the positional relationship between the semiconductor wafer 202 and the silicon mask 204 is not changed in steps S30 and S32, the relative offset of the positions among the diode short carrier lifetime region 39, the IGBT short carrier lifetime region 59, and the cathode layer 30 is prevented. Consequently, upon the mass production of the semiconductor devices 200, the fluctuation of the characteristics among the semiconductor devices 200 can be suppressed. Furthermore, according to the manufacturing method of the second embodiment, all of the irradiated charged particles pass through the silicon mask 204. Because the charged particles do not stop inside the silicon mask 204, the silicon mask 204 is less subject, to damage. Therefore, the durability of the silicon mask 204 can be kept high.

Third Embodiment

Figure 11:
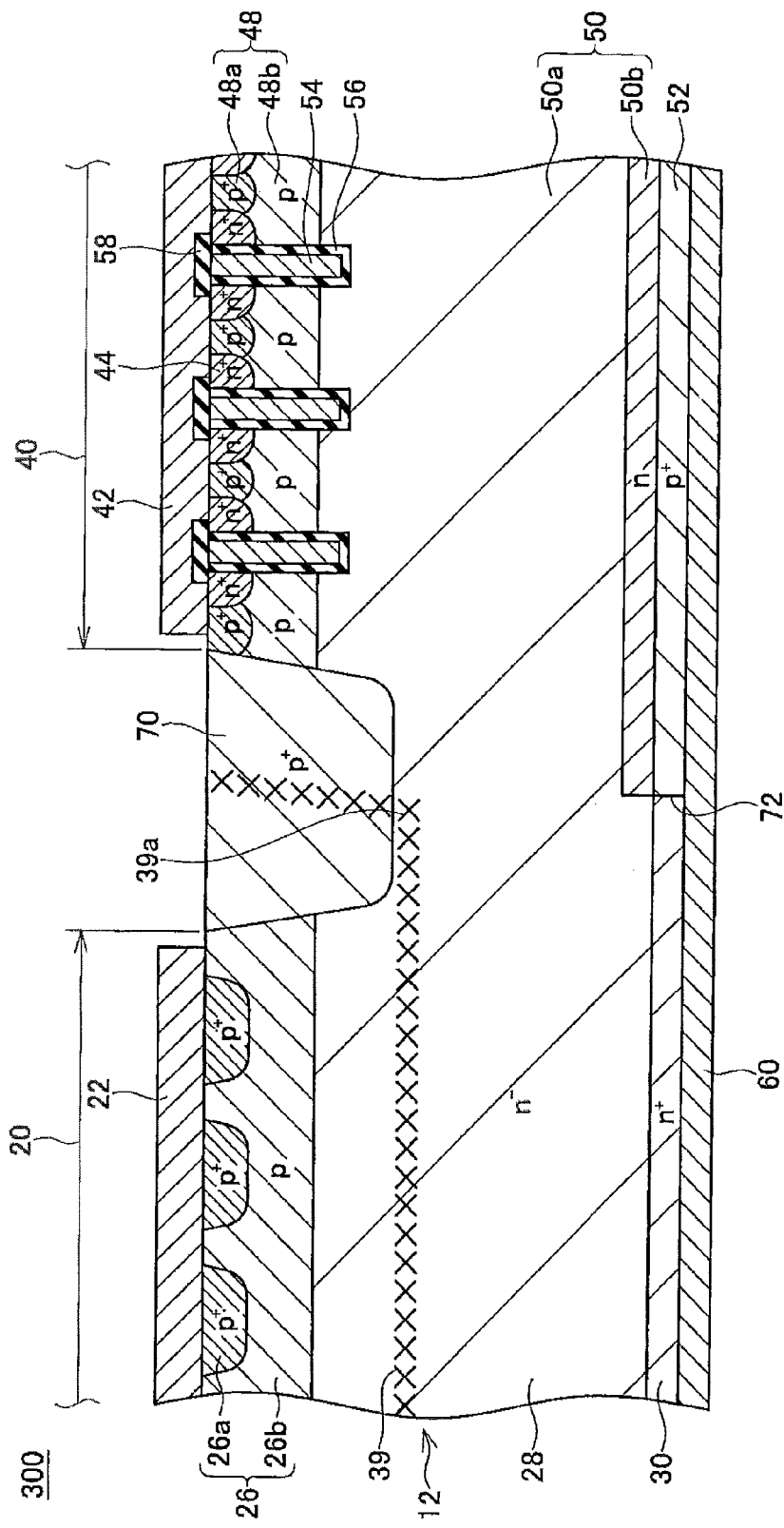
FIG. 11 is a cross-sectional diagram of a semiconductor device 300 manufactured by a manufacturing method according to a third embodiment.

Next, a method of manufacturing a semiconductor device according to a third embodiment is described. FIG. 11 shows a semiconductor device 300 manufactured by the manufacturing method according to the third embodiment. As shown in FIG. 11, in the semiconductor device 300 of the third embodiment, crystal defects are distributed toward the upper surface side of the semiconductor substrate 12 (upward in FIG. 11) in a region on the IGBT region 40 side from the end portion 39a of the diode short carrier lifetime region 39. The rest of the structure of the semiconductor device 300 according to the third embodiment is substantially the same as that of the semiconductor device 10 of the first embodiment.

Figure 12:
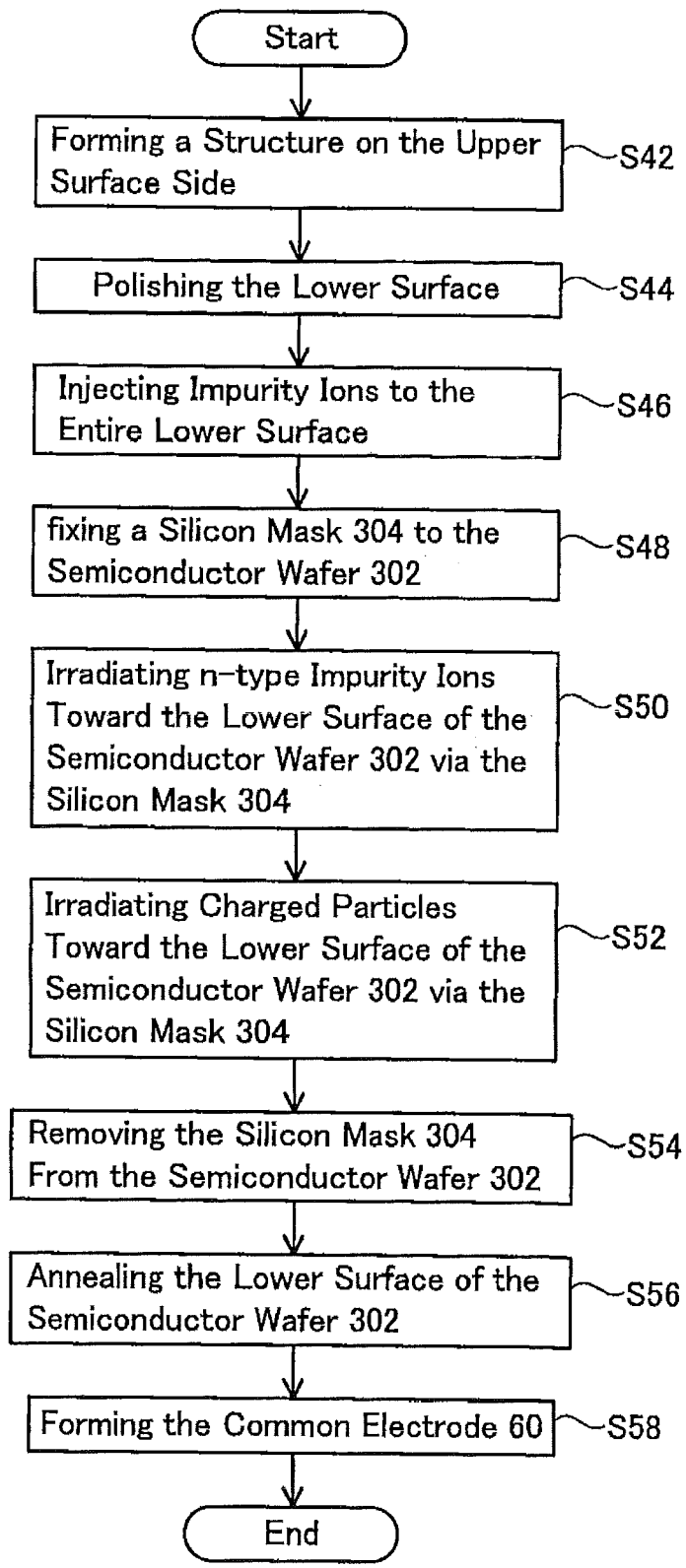
FIG. 12 is a flowchart of the manufacturing method according to the third embodiment.

The method of manufacturing the semiconductor device 300 according to the third embodiment is now described. FIG. 12 is a flowchart of the manufacturing method according to the third embodiment. Steps S42 to S44 shown in FIG. 12 are executed in a substantially same manner as steps S2 to S4 of the manufacturing method according to the first embodiment.

In step S46, n-type impurity ions are injected to the entire lower surface of a semiconductor wafer 302. When injecting the n-type impurity ions, the irradiation energy of the impurity ions is adjusted so that the n-type impurity ions stop at a depth corresponding to the cathode layer 30.

In step S48, a silicon mask 304 is bonded to the lower surface of the semiconductor wafer 302, in a substantially same manner as the manufacturing method according to the first embodiment. Note, in step S48, that the position of the region where the collector layer 52 is to be formed and the position of penetrating holes 304a of the silicon mask 304 are adjusted so as to coincide with each other when the semiconductor wafer 302 is planarly viewed as shown in FIG. 13, and then the silicon mask 304 is bonded to the semiconductor wafer 302.

Figure 13:
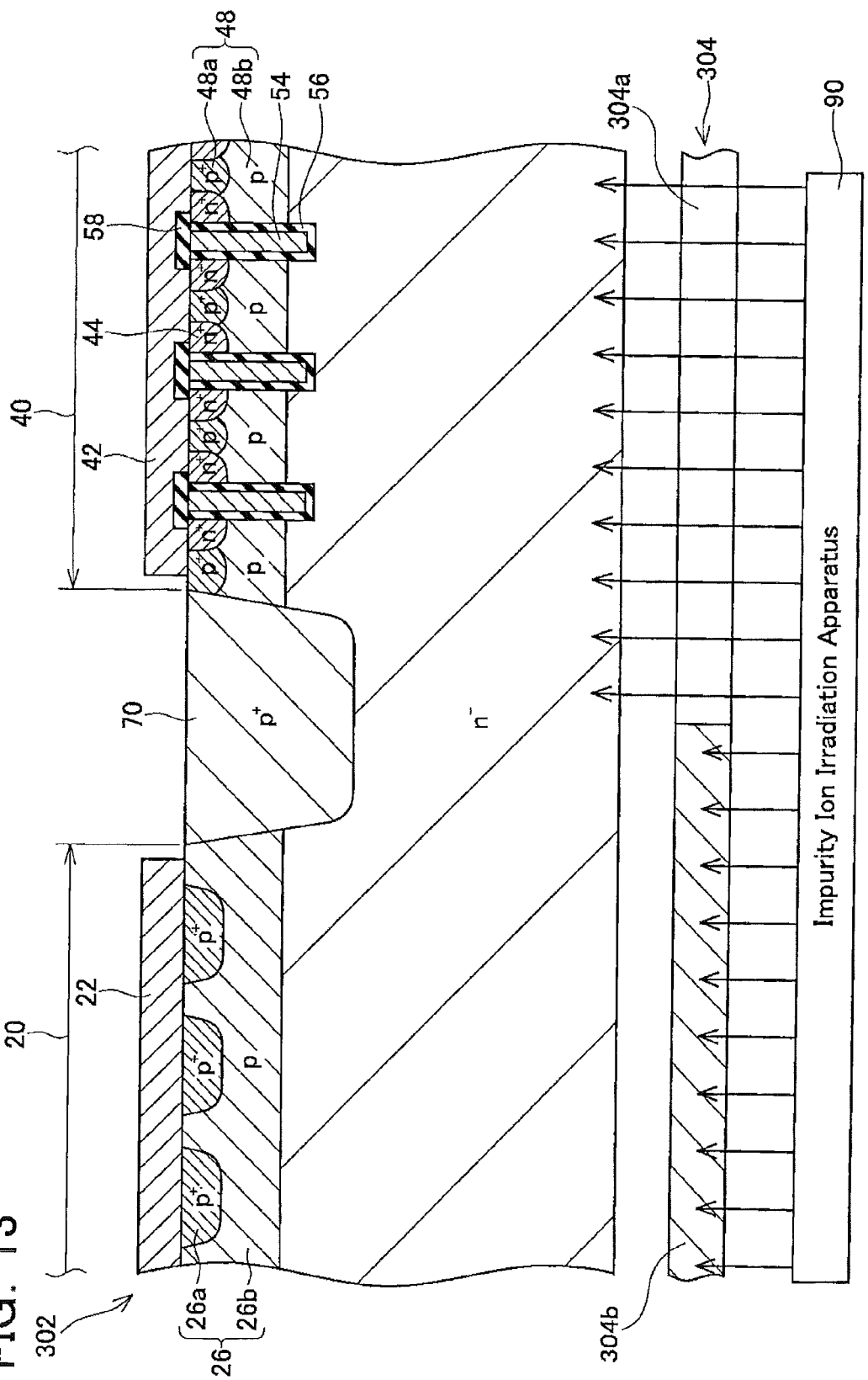
FIG. 13 is an, explanatory diagram illustrating a step of selectively injecting impurity ions using the manufacturing method according to the third embodiment.

In step S50, impurity ions are irradiated from the impurity ion irradiation apparatus 90 toward the lower surface of the semiconductor wafer 302 on which the silicon mask 304 is bonded, as shown in FIG. 13. In step S50, first, the n-type impurity ions are irradiated. The n-type impurity ions irradiated toward the penetrating holes 304a pass through the penetrating holes 304a and are then injected to the semiconductor wafer 302. In this case, the irradiation energy of the impurity ions is adjusted so that the n-type impurity ions passing through the penetrating holes 304a stop at a depth corresponding to the buffer layer 50b. On the other hand, the n-type impurity ions irradiated toward a mask portion 304b stop within the mask portion 304b. Therefore, the n-type impurity ions are injected only to the range where the buffer layer 50b is to be formed. Note that, in step S50, the n-type impurity ions are injected in the concentration lower than that of the n-type impurity ions injected in step S46. Next, p-type impurity ions are irradiated. The p-type impurity ions irradiated toward the penetrating holes 304a pass through the penetrating holes 304a and are then injected to the semiconductor wafer 302. In this case, the irradiation energy of the impurity ions is adjusted so that the p-type impurity ions passing through the penetrating holes 304a stop at a depth corresponding to the collector layer 52. On the other hand, the p-type impurity ions irradiated toward the mask portion 304b stop within the mask portion 304b. Therefore, the p-type impurity ions are injected only to the range where the collector layer 52 is to be formed. Note that, in step S50, the p-type impurity ions are injected in the concentration lower than that of the n-type impurity ions injected in step S46.

Figure 14:
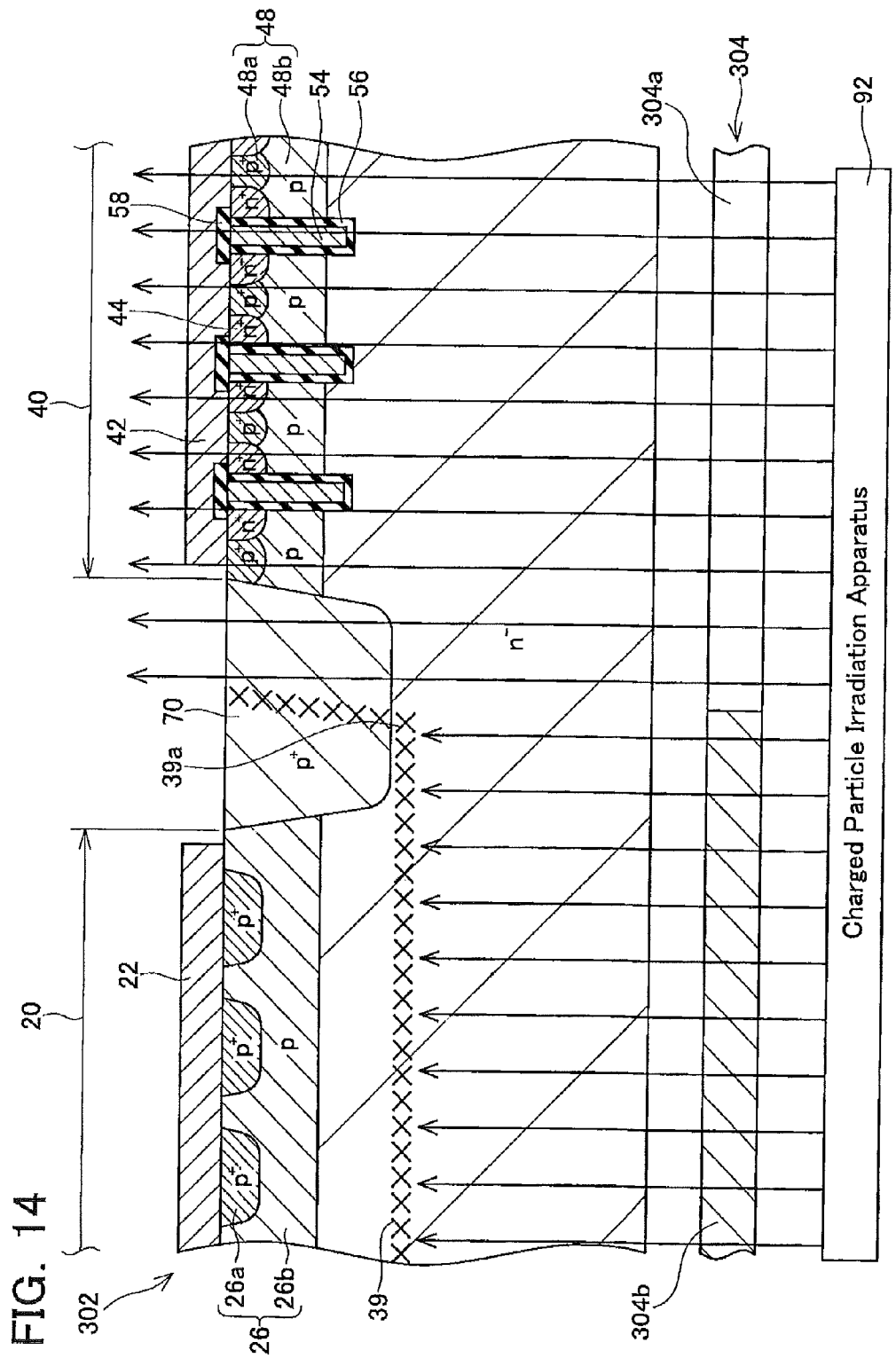
FIG. 14 is an explanatory diagram illustrating a step of injecting charged particles using a manufacturing method according to a fourth embodiment.

In step S52, charged particles are irradiated from the charged particles irradiation apparatus 92 toward the lower surface of the semiconductor wafer 302 on which the silicon mask 304 is bonded, as shown in FIG. 14. Note that step S52 is executed without changing the positional relationship between the silicon mask 304 and the semiconductor wafer 302 from the positional relationship in step S50. In step S52, the irradiation energy of the charged particles is adjusted so that the charged particles passing through the penetrating holes 304a penetrate (pass through) the semiconductor wafer 302 and so that the charged particles irradiated toward the mask portion 304b penetrate (pass through) the mask portion 304b and stop at a dept corresponding to the diode short carrier lifetime layer 39 of the semiconductor wafer 302. Therefore, the charged particles irradiated toward the mask portion 304b stop within the diode drift layer 28. Consequently, the short carrier lifetime region 39 is formed. On the other hand, the charged particles irradiated toward the opening 304a penetrate the semiconductor wafer 302. When the charged particles stop inside the semiconductor wafer 302, the charged particles generate crystal defects at a position where the charged particles stop. However when the charged particles pass through the inside of the semiconductor wafer 302, the crystal defects are hardly generated. Therefore, almost no crystal defects are formed within the range corresponding to the opening 304a in the semiconductor wafer 302. Therefore, the short carrier lifetime region 39 is formed only in the diode region 20 of the semiconductor wafer 302, as shown in FIG. 14.

Step S54 is executed in a substantially same manner as step S14 of the first embodiment. In step S56, the lower surface of the semiconductor wafer 302 is locally heated using the laser anneal apparatus. As a result, the impurity ions injected to the semiconductor wafer 302 in steps S46 and S50 are activated, and the cathode layer 30, the collector layer 52, and the buffer layer 50b is formed as shown in FIG. 11. In other words, because the concentration of the p-type impurity ions injected in step S50 is higher than the concentration of the n-type impurity ions injected in step S46, the region where the p-type impurity ions are injected in step S50 becomes the p-type collector layer 52 by the activation of the impurity ions. The region where the n-type impurity ions are injected in step S46 and the p-type impurity ions are not injected in step S50 (the region masked by the mask portions 304b) becomes the n-type cathode layer 30 by the activation of the impurity ions. Moreover, the region where the n-type impurity ions are injected in step S50 becomes the n-type buffer layer 50b by the activation of the impurity ions. Step S58 is executed in a substantially same manner as step S18 of the first embodiment. As a result, the semiconductor device 300 is completed.

As described above, according to the manufacturing method of the third embodiment, the region where the impurity ions are injected in step S50 and the region where the helium ions are injected in step S52 are defined by the same silicon mask 304. Because the relative positional relationship between the semiconductor wafer 302 and the silicon mask 304 is not changed in steps S50 and S52, the relative offset of the positions among the diode short carrier lifetime region 39, the cathode layer 30, the buffer layer 50b, and the collector layer 52 is prevented. Accordingly, upon the mass production of the semiconductor devices 300, the fluctuation of the characteristics among the semiconductor devices 300 can be suppressed. Furthermore, according to the manufacturing method of the third embodiment, all of the irradiated charged particles pass through the silicon mask 304. Because the charged particles do not stop inside the silicon mask 304, the silicon mask 304 is less subject to damage. Therefore, the durability of the silicon mask 304 can be kept high.

The buffer layer 50b is formed in the third embodiment described above. However, when the buffer layer 50b is not required, the buffer layer 50b may not be formed. In this case, the injection of the n-type impurity ions executed in step S50 can be omitted.

Figure 15:
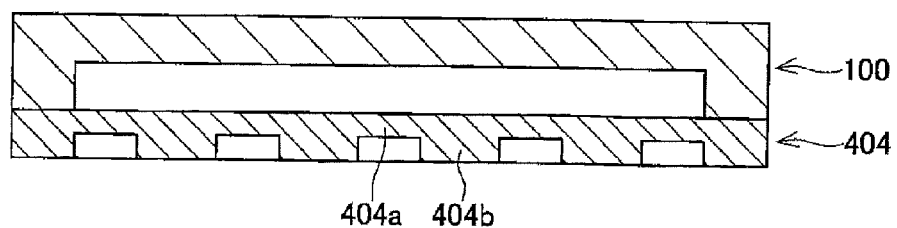
FIG. 15 is a diagram showing a silicon mask 404 according to a modification.

The silicon masks having the penetrating holes and mask portions are used in the first to third embodiments described above. However, a silicon mask 404 having a thin portion 404a and a thick portion 404b as shown in FIG. 15 may be used. When using the silicon mask 404, a semiconductor device can be manufactured in a substantially same manner as the first to third embodiments, by executing an impurity ion injecting step in which the irradiated impurity ions penetrate the thin portion 404a, but the irradiated impurity ions do not penetrate the thick portion 404b.

Figure 16:
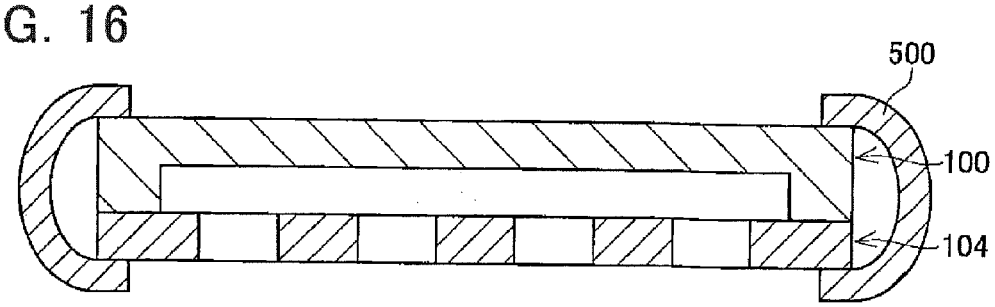
FIG. 16 is a diagram showing a silicon mask fixing method according to a modification.
Figure 17:
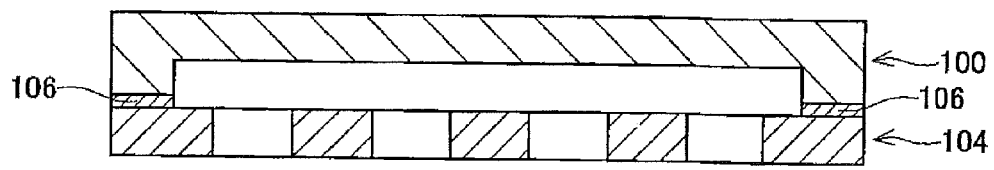
FIG. 17 is a diagram showing another silicon mask fixing method according to the modification.

According to the first to third embodiments described above, the silicon mask is bonded to the semiconductor wafer, but the silicon mask may be fixed to the semiconductor wafer using other methods. For example, the silicon mask 104 may be fixed to the semiconductor wafer 100 by using a fixing jig 500 as shown in FIG. 16. In addition, as shown in FIG. 17, silicon oxide films 106 may be formed previously on joint surfaces between the semiconductor wafer 100 and the silicon mask 104, then the silicon oxide films 106 may be joined to each other after activating the surfaces of the silicon oxide films 106 by performing Ar plasma irradiation thereon in order to join the semiconductor wafer 100 and the silicon mask 104 to each other. In this case, the silicon mask 104 can be removed from the semiconductor wafer 100 by etching the silicon oxide films 106.

Figure 18:
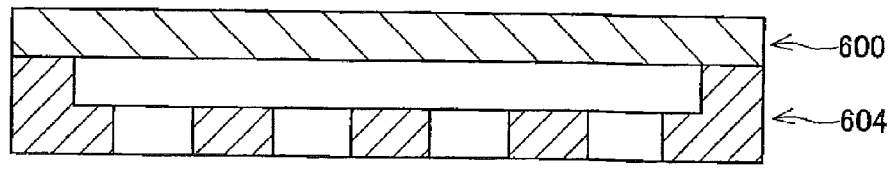
FIG. 18 is a diagram showing a silicon mask 604 according to a modification.

In the first to third embodiments described above, the concave portions are formed on the lower surfaces of the semiconductor wafers. However, a lower surface of a semiconductor wafer 600 may be kept flat, and a concave portion may be formed on an upper surface of a silicon mask 604, as shown in FIG. 18. With this configuration as well, a lower surface of a central part of the semiconductor wafer 600 can be prevented from being scratched.

Figure 19:
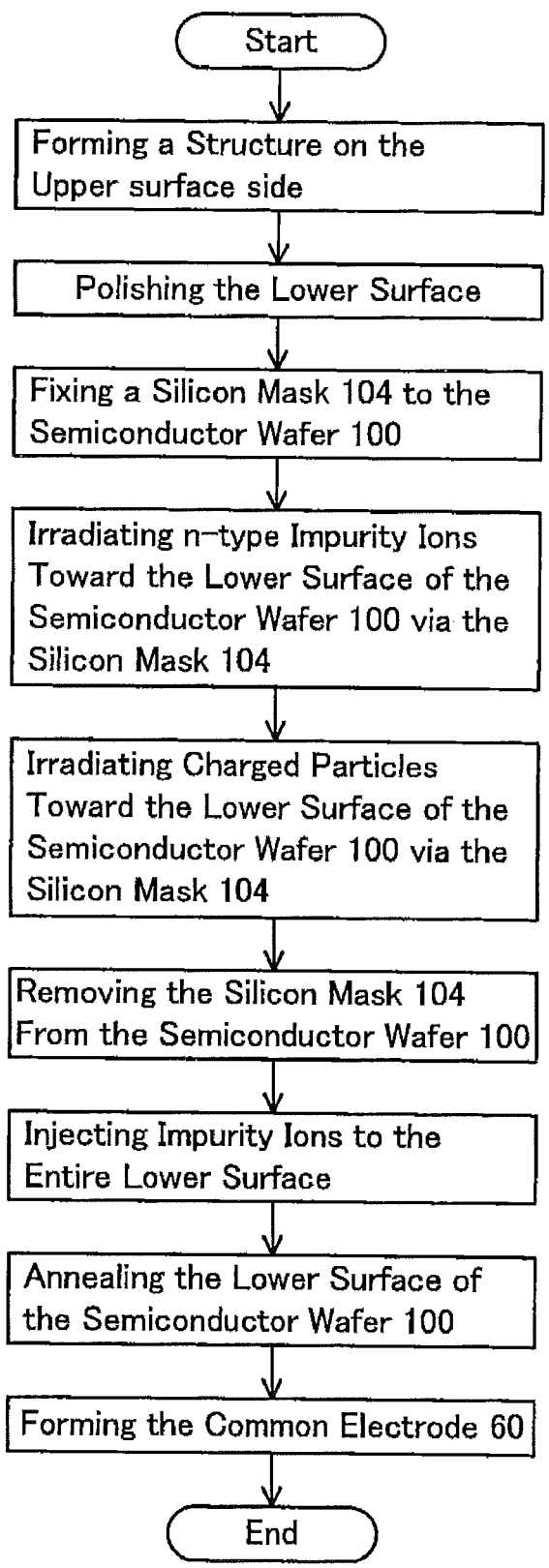
FIG. 19 is a flowchart showing a manufacturing method according to a modification.
Figure 20:
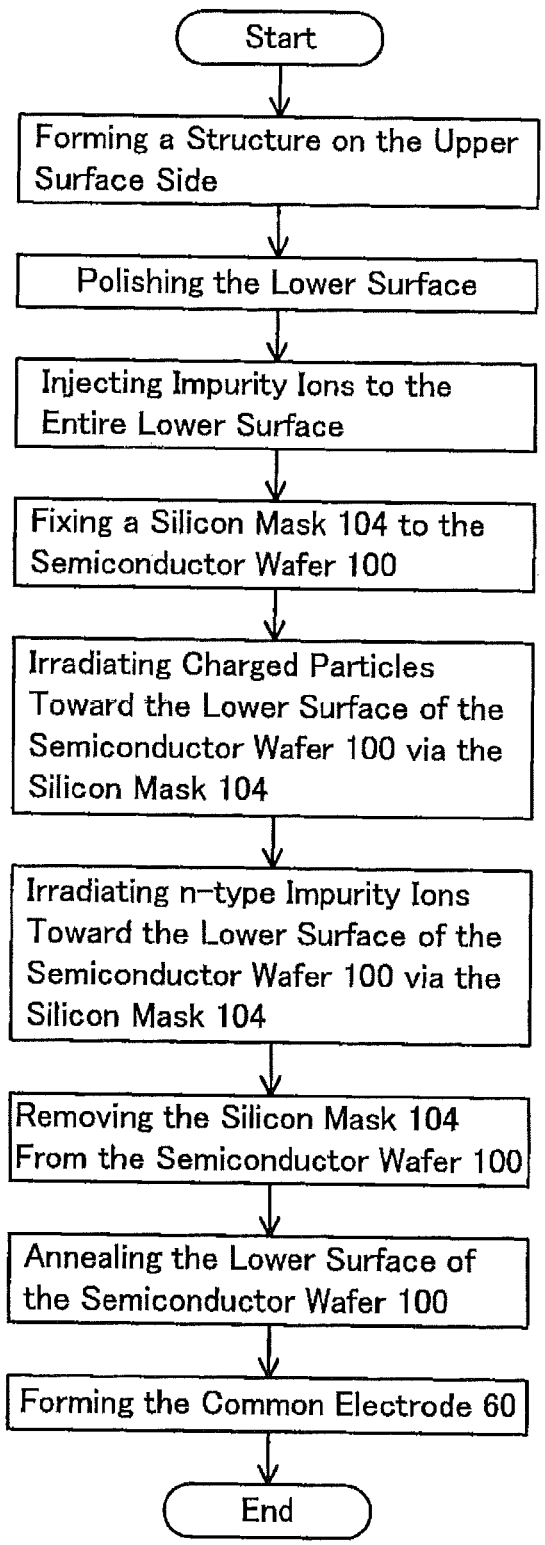
FIG. 20 is a flowchart showing a manufacturing method according to a modification.

In the first to third embodiments described above, the step of injecting the impurity ions to the entire lower surface of the semiconductor wafer (steps S6, S26, S46), the step of injecting the impurity ions through the silicon mask (steps S10, S30, S50), and the step of injecting the charged particles (steps S12, S32, S52) are executed in this order. However, the order of these steps can be changed accordingly. For instance, when manufacturing the same semiconductor device as that of the first embodiment, these steps may be executed in the order shown in FIG. 19 or FIG. 20.

In the first to third embodiments described above, the ranges for injecting the impurity ions and the charged particles are selected by the silicon mask, however, these injection ranges may be selected by forming a thick resist layer on the surface of each semiconductor wafer.

What is claimed is:

1. A method of manufacturing a semiconductor device, comprising:
   fixing a mask to a semiconductor substrate, wherein the mask is a either a mask comprising a first portion having a small thickness and a second portion thicker than the first portion or a mask comprising a first portion configured by a penetrating hole and a second portion having a predetermined thickness,
   irradiating n-type or p-type impurity ions from an impurity ion irradiation apparatus to a semiconductor substrate via the mask fixed to the semiconductor substrate, the impurity ions passing through the first portion are injected into the semiconductor substrate,
   irradiating charged particles from a charged particle irradiation apparatus to the semiconductor substrate via the mask fixed to the semiconductor substrate,
   wherein the charged particles passing through at least one of the first portion and the second portion are injected into the semiconductor substrate, and a short carrier lifetime region in which a carrier lifetime is shortened is formed in the semiconductor substrate within a range in which the charged particles are injected, and removing the mask from the semiconductor substrate, wherein a positional relationship between the mask and the semiconductor substrate is not changed from a beginning of one of the irradiating the impurity ions and the irradiating the charged particles to a completion of both of the irradiating the impurity ions and the irradiating the charged particles.

2. The method of claim 1, wherein the semiconductor device is a vertical semiconductor device including an IGBT and a diode, in the irradiating the impurity ions, the n-type impurity ions passing through the first portion are injected into a region corresponding to a cathode region of the diode, and in the irradiating the charged particles, the charged particles passing through the first portion are injected into a region corresponding to a drift region of the diode.

3. The method of claim 1, wherein in the irradiating the impurity ions, the impurity ions irradiated to the second portion of the mask stop in the mask, and in the irradiating the charged particles, the charged particles irradiated to the first portion of the mask pass through the first portion and are injected into the semiconductor substrate, and the charged particles irradiated to the second portion of the mask stop in the mask.

4. The method of claim 1, wherein in the irradiating the impurity ions, the impurity ions irradiated to the second portion of the mask stop in the mask, and in the irradiating the charged particles, the charged particles irradiated to the first portion of the mask pass through the first portion and are injected into the semiconductor substrate, and the charged particles irradiated to the second portion of the mask pass through the second portion and are injected into the semiconductor substrate.

5. The method of claim 1, wherein the semiconductor device is a vertical semiconductor device including an IGBT and a diode, in the irradiating the impurity ions, the p-type impurity ions passing through the first portion are injected into a region corresponding to a collector region of the IGBT, and in the irradiating the charged particles, the charged particles passing through the second portion are injected into a region corresponding to a drift region of the diode.

6. The method of claim 1, wherein in the irradiating the impurity ions, the impurity ions irradiated to the second portion of the mask stop in the mask, and in the irradiating the charged particles, the charged particles irradiated to the first portion of the mask pass through the first portion and the semiconductor substrate, and the charged particles irradiated to the second portion of the mask pass through the second portion and are injected into the semiconductor substrate.

* * * * *

UNITED STATES PATENT AND TRADEMARK OFFICE
CERTIFICATE OF CORRECTION

PATENT NO. : 8,334,193 B2
APPLICATION NO. : 13/242789
DATED : December 18, 2012
INVENTOR(S) : Shinya Iwasaki et al.

It is certified that error appears in the above-identified patent and that said Letters Patent is hereby corrected as shown below:

In the Specifications

Column 2, line 35, change "The mask is a" to --The mask is--;

Column 3, line 42, change "is an, explanatory" to --is an explanatory--;

Column 6, line 31, change "48a is found" to --48a is formed--;

Column 11, line 61, change "subject, to damage" to --subject to damage--;

In the Claims

Column 14, line 53, change "mask is a either" to --mask is either--.

Signed and Sealed this
Fourteenth Day of May, 2013

Teresa Stanek Rea
*Acting Director of the United States Patent and Trademark Office*